US009437327B2

United States Patent
Curley et al.

(10) Patent No.: US 9,437,327 B2
(45) Date of Patent: *Sep. 6, 2016

(54) COMBINED RANK AND LINEAR ADDRESS INCREMENTING UTILITY FOR COMPUTER MEMORY TEST OPERATIONS

(71) Applicant: International Business Machines Corporation, Armonk, NY (US)

(72) Inventors: Lawrence D. Curley, Endwell, NY (US); Patrick J. Meaney, Poughkeepsie, NY (US); George C. Wellwood, Poughkeepsie, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 15/063,727

(22) Filed: Mar. 8, 2016

(65) Prior Publication Data

US 2016/0172055 A1    Jun. 16, 2016

Related U.S. Application Data

(63) Continuation of application No. 14/211,288, filed on Mar. 14, 2014, now Pat. No. 9,298,614.

(51) Int. Cl.
*G11C 29/10* (2006.01)
*G06F 11/263* (2006.01)
*G06F 11/07* (2006.01)

(52) U.S. Cl.
CPC ............ *G11C 29/10* (2013.01); *G06F 11/0727* (2013.01); *G06F 11/0787* (2013.01); *G06F 11/2635* (2013.01)

(58) Field of Classification Search
None
See application file for complete search history.

(56) References Cited

U.S. PATENT DOCUMENTS

| 6,782,467 | B1 * | 8/2004 | Rezeanu | G11C 7/1006 711/209 |
| 9,003,246 | B2 | 4/2015 | Mozak et al. | |
| 2007/0198807 | A1 * | 8/2007 | Rezeanu | G11C 8/04 711/217 |
| 2009/0319718 | A1 * | 12/2009 | Aldworth | G06F 12/0653 711/5 |

* cited by examiner

*Primary Examiner* — Daniel Tsui
(74) *Attorney, Agent, or Firm* — Cantor Colburn LLP; Margaret McNamara

(57) ABSTRACT

Embodiments include a combined rank and linear memory address incrementing utility. An aspect includes an address incrementing utility suitable for implementation within a memory controller as an integrated subsystem of a central processing unit (CPU) chip. In this type of on-chip embodiment, the address incrementing utility utilizes dedicated hardware, chip-resident firmware, and one or more memory address configuration maps to enhance processing speed, efficiency and accuracy. The combined rank and linear memory address incrementing utility is designed to efficiently increment through all of the individual bit addresses for a large logical memory space divided into a number of ranks on a rank-by-rank basis. The address incrementing utility sequentially generates all of the sequential memory addresses for a selected rank, and then moves to the next rank and sequentially generates all of the memory addresses for that rank, and so forth until of the ranks have been processed.

1 Claim, 7 Drawing Sheets

COMBINED RANK AND LINEAR ADDRESS INCREMENTING UTILITY FOR COMPUTER MEMORY TEST OPERATIONS

DOMESTIC PRIORITY

This application is a continuation of U.S. patent application Ser. No. 14/211,288, filed Mar. 14, 2014, the content of which is incorporated by reference herein in its entirety.

BACKGROUND

The present invention relates generally to computer systems, and more specifically, to a combined rank and linear address incrementing utility for computer memory test operations.

Server systems requiring extremely high reliability and availability must be capable of continually monitoring memory subsystems for errors, correcting data errors, and repairing hardware errors to prevent data corruption, system checkstops, and other types of failures. Server systems with large memory subsystems require the ability to verify functionality and initialize large blocks of memory at power on, initial machine load (IML) time. A large memory subsystem may include a number of similar memory configurations, such as number of similarly configured multi-chip memory boards, forming a large memory address space. Overall memory access times for the subsystem are usually optimized by grouping the physical memory elements (chips) into a number of ranks (groups of chips smaller than the full array committed to an individual memory board) and assigning different contiguous portions of the logical address space to different ranks. This ensures that that multiple physical ranks of memory are activated when accessing large continuous blocks of data stored in sequential addresses of the logical address space.

A complex and robust memory controller design is capable of reliably initializing (which may also be referred to as resetting or clearing), background testing (which may also be referred to as scrubbing), and running a variety of read-write test operations (which may also be referred to as self-test or pattern testing) a range of different memory configurations. Various types of testing operations are commonly referred to as built-in self-test (BIST), array BIST (ABIST), and logic BIST (LBIST) operations. These test operations allow data errors to be detected and corrected using error correction code (ECC) logic to prevent data integrity failures and system checkstops from arising due to repairable data errors.

Test operations may also detect unrecoverable hardware errors occurring in the memory devices, such as shorted bits and other types of chip failures. This allows the defective hardware elements to be deactivated (which may also be referred to as masking) before they result in serious data corruption and system failures. Sophisticated testing and analysis may also detect impending failures so that memory subsystems showing signs or patterns of errors indicating an increased likelihood of a major failure in near future can be repaired or replaced before major system failures occur.

SUMMARY

Embodiments include a method, system, and computer program product for a combined rank and linear address incrementing utility for a computer system. A memory address map register is configured to selectively store memory address maps for a number of different types of memory configurations. A rank register is configured to store a number of rank address bits mapped from the memory address map register corresponding to one or more rank address fields of the memory address map register. A non-rank register is configured to store number of non-rank address bits mapped from the memory address map register corresponding to one or more non-rank address fields of the memory address map register. A selected address register is configured to receive a sequence of bits mapped from the rank register and the non-rank register to define a range of selected memory addresses within the selected address register. In addition, increment logic is configured to increment the rank register and the non-rank register to sequentially generate ranges of addresses corresponding to address spaces of the different memory configurations for testing those memory configurations. The increment logic is further configured to selectively operate in a linear mode for generating addresses corresponding to a selected rank, or to operate in a rank mode for generating addresses corresponding to a plurality of ranks on a rank-by-rank basis.

An aspect includes loading a current memory address map corresponding to a memory configuration into the memory address map register. A number of rank address bits are mapped from the rank register to the selected memory address map register based on the current memory address map. Similarly, a number of non-rank address bits are mapped from the non-rank address register to the selected memory address map register based on the current memory address map. The increment logic may selectively enter into a linear mode, in which it increments the non-rank register while not incrementing the rank register to sequentially generate a range of addresses corresponding to a selected rank of the memory configuration. The increment logic may also selectively enter into a rank mode, in which it increments the non-rank register and the rank register to sequentially generate ranges of addresses corresponding to a number of selected ranks of the memory configuration on a rank-by-rank basis.

BRIEF DESCRIPTION OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

DETAILED DESCRIPTION

Figure 1:
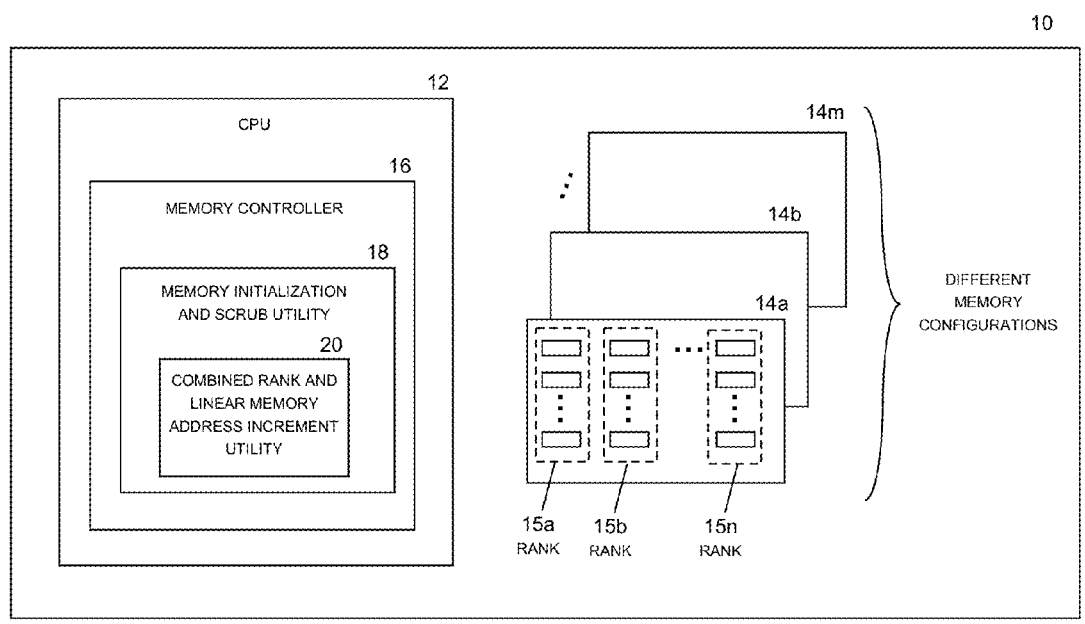
FIG. 1 depicts an illustrative computer system including a combined linear and rank address incrementing utility for computer memory test operations in accordance with an embodiment.

Embodiments include a combined rank and linear memory address incrementing utility, which may be referred to as the "address incrementing utility" as a shorter identifier. The address incrementing utility supports a wide range of different memory configurations and a wide range of different test operations in a versatile and efficient manner. Prior address incrementers have utilized software or firmware logic without the benefit of a well-designed dedicated hardware structure, producing inflexible, inefficient and error prone incrementing utilities. The significantly improved address incrementing utility is suitable for implementation within a memory controller, which is itself configured as an integrated subsystem within a central processing unit (CPU) chip. In this type of on-chip embodiment, the address incrementing utility utilizes a number of dedicated hardware registers, chip-resident firmware, and one or more memory address configuration maps to enhance processing speed, efficiency and accuracy.

The combined rank and linear memory address incrementing utility is designed to efficiently generate (by incrementing through) all of the individual bit addresses defining a large logical address space for an array of physical memory devices divided into a number of ranks. For example, each different type of memory configuration may be a different type of dynamic random access memory (DRAM) board, each memory configuration may be a specific type of DRAM board, each board may contain an array of similar DRAM chips, and each rank may be a group of chips on a board smaller than the full array committed to an individual board. In a process known as "walking the ranks," the address incrementing utility sequentially generates all of the memory addresses for a selected rank (also referred to as processing the ranks), and then moves to the next rank to sequentially generate all of the memory addresses for that rank (process that rank), and so forth until of the ranks have been processed on a rank-by-rank basis. Each address generated may be supplied to a calling test operation, which applies a particular test operation to each memory address corresponding to a data bit. To provide a few examples, the test operation may include clearing the bit (initialization), setting and resetting the bit (write testing), reading the bit to determine whether it contains the correct value corresponding to a test pattern loaded into the memory configuration (pattern testing), and so forth.

The address incrementing utility is generally indifferent to the specific test operation performed by the calling test program. Similarly, the address incrementing utility is generally indifferent to the specific type of memory configuration. Embodiments may therefore sequentially process or "walk the ranks" quickly and efficiently for a wide range of memory configurations as well as a wide range of test and repair operations. By way of example, certain illustrative testing and repair operations are described in U.S. Pat. No. 9,136,019, which is incorporated herein by reference in its entirety.

Although the combined rank and linear memory address incrementing utility is generally indifferent to the specific test operation utilizing the addresses generated, the utility may include a set of control registers allowing certain test parameters to be set on a case-by-case basis. For example, a control register may be set to a "rank mode" in which the utility generates addresses for multiple ranks on a rank-by-rank basis, or to a "linear mode" in which addresses are generated across all ranks (or only for a selected rank). As another example, control registers may also be used to identify the specific type of memory configuration being tested, which in turn identifies the correct memory address map to be loaded into a current address map register for testing the corresponding memory configuration.

The address incrementing utility may accept a range of different memory configuration maps corresponding to a number of different memory configurations provided that they fall within the general address map format. In the disclosed embodiments, this general address map format is common to the class of memory configurations currently utilized by industry-standard DRAM memory boards. The overall memory subsystem may include several memory boards having the same configuration, where each memory board includes several ranks, and each rank contains a number of similar chips forming a contiguous portion of the logical address space. In addition, the overall memory subsystem may include a number of different types of memory configurations (e.g., different types of memory cards). For this alternative, the address incrementing utility may also "walk the boards" to sequentially process a number of different types of memory configuration included in the host computer system, and "walk the ranks" for type of memory configuration.

Turning now to FIG. 1, an illustrative computer system 10 including a combined linear and rank address incrementing utility 20 for computer memory test operations is generally shown. The computer system 10 includes a CPU 12 (typically a single integrated silicon chip) and one or more memory configurations 14a-m (typically DRAM boards) utilized by the CPU in the ordinary course of computer operations. For the purpose of illustrating the versatility of the address incrementing utility 20, the memory configurations 14a-m may include several different types of memory configurations (e.g., DRAM boards containing memory arrays of differing sizes, and/or arrays of different types of DRAM chips). The CPU 12 includes a memory controller 16 containing firmware for operating the various memory configurations 14a-m. An illustrative memory configuration 14a shows that each memory configuration includes an array of similar memory elements (e.g., DRAM chips), which are grouped into a number of ranks 15a-n. In this particular example, each column of the array is grouped into a rank, but this is merely a matter of illustrative convenience. In practice, the ranks are usually defined to optimize operational efficiency while providing suitably sized ranks for data reconstruction and repair masking.

To provide for memory initialization as well as a variety of testing and repair operations (e.g., IML, LBIST, ABIST, etc.), the memory controller 16 includes a memory initialization and scrub utility 18. This utility, in turn, includes the combined linear and rank address incrementing utility 20, which is implemented through on-chip dedicated hardware and associated firmware to serve the specific function of sequentially generating memory addresses to support the various initialization and test operations performed by the memory initialization and scrub utility 18 (which may further interact with external resources during testing and repair operations). The address incrementing utility 20 is configured to selectively generate memory address on a linear basis (i.e., for a selected rank) or on a rank-by-rank basis.

As the physical DRAMs supporting modern computer systems have become increasingly dense, holding more data bits per physical DRAM component (chip), verifying that the physical DRAM components are working correctly and identifying which DRAM component(s) are bad when they do fail has become increasingly important. Making the testing operations run quickly and accurately has also become increasingly difficult as the memory density has increases and different types of memory configurations have become available.

Various test and repair operations have been developed to check each bit (memory address) of each DRAM chip for functionality both at "power on" time and often as a "background" function running during system operation, while the computer system is running other customer applications. These test operations are commonly referred "self-test" and "scrub" operations. A self-test operation is normally performed at power on time, while "scrub" refers to an operation performed after the computer system has been initialized and may run in the background while the computer is running other customer applications. Since no other operations are accessing DRAMs at power on time, self-test is allowed to store data patterns (fixed or random) into the DRAMs, read them back out, and the perform comparisons to identify failing DRAMs.

Since customer applications are running during a scrub, this type of test is not allowed to store patterns into DRAMs which could corrupt customer application data. Scrub only "reads" memory and tabulates errors as they are detected via the error correction code (ECC) used to protect all data in memory in modern computer systems. With the appropriate address interlock safeguards, scrub can force store write backs to memory locations when correctable errors are detected by the ECC logic. This write-back procedure is useful for eliminating transient errors that are normally due to alpha or cosmic particle strikes or noise (these correctable errors are referred to as soft errors). Uncorrectable detected errors, on the other hand, should never elicit a write back to memory, since the uncorrected data would be stored back to memory as data with correct ECC. This would cause subsequent fetches of the data to return incorrect data, which would create another data integrity problem.

DRAM boards are organized into banks or blocks of DRAM chips (often referred to as DRAMs) represented by the ranks $15a$-$15m$, with each rank consisting of a range of addresses for which the bank stores data. All DRAM devices typically have access times specifying the time delay from the point-in time an address is presented to the DRAM address pins to the point-out time the data is available at the output data pins of the DRAM. A characteristic of DRAM technology is that multiple accesses to the same DRAM expands the time between an address being presented to the DRAM input and the time at which the data is available at the output of the DRAM. The expanded delay can directly impact computer performance when the computer processor must stop processing instructions to wait for data from DRAMs.

To minimize the probability of consecutive DRAM accesses, the address space is usually designed in such a way that large blocks of sequential logical addresses are not likely to access the same set of physical DRAMs. By "scrambling" the addressing space such that different portions of large logical memory blocks usually reside on different physical ranks of DRAMs, the overall/average DRAM access times for the computer system can be optimized. As a result, even in cases where a computer program does access a large block of contiguous data, the data is stored on multiple ranks of DRAMs, which minimizes the access time for the block of data and ensures optimal overall computer performance averaged over time.

The ranks of DRAMs are represented conceptually by the ranks $15a$-$m$ in FIG. 1. A rank is a group of physical memory elements accessed together to provide a contiguous portion of addressed memory space for the computer system. Depending on the amount of memory installed in a computer system, the number of installed ranks may vary from only a few ranks of memory to many ranks of memory. The address range for a given rank of DRAMs may also vary depending on the size and type of DRAMs making up the rank. Each rank normally consists of a relatively small number of chips representing a relatively small portion of the overall logical address space. The number of bits used to address the various ranks (rank address bits) of a particular memory configuration can be as few as one or two bits or as many as five or six bits or greater depending on the type and amount of DRAM installed in the computer system.

Within the logical memory address space, the rank address bits are purposely not confined to a fully contiguous set of address bits. Usually they include a combination of low-order rank address bits and high-order rank address bits. By selecting low-order rank address bits to be part of the rank address scheme, contiguous memory accesses generally select different ranks as the address increments. This ensures optimal memory performance in cases where back-to-back to back memory requests are made for contiguous data blocks. Using high-order rank address bits generally reduces the power consumption, since fewer ranks are often powered on at the same time. Including some number of high-order address bits as part of the rank address also provides a vehicle for partitioning the address space and identifying blocks of memory as certain types of keys, such as operating system blocks, etc.

Since memory test operations are used for both clearing/initializing memory as well as detecting bit errors and identifying the failing DRAM(s), both at power on time and during system operation, the test logic should provide flexibility to address memory DRAMs from both a rank address perspective and a linear address perspective. Conventionally, two separate increment designs have been utilized to support both rank mode address incrementing and linear address mode incrementing. Linear address mode incrementing usually generates the next address based on the previous address plus one for all of existing memory in a specified range. Rank address mode incrementing holds those address bits designated as rank bits constant while incrementing the remaining bits of the address, until the end of the rank is reached. Complicating the design is the fact that any given computer system may have many address map configurations which must be supported in the increment logic, which can require complicated programming support and may be difficult to design in hardware.

Designing the address incrementing logic to generate the "next address" increment for each mode, and for each possible memory configuration, can be costly from a silicon area perspective and potentially from a timing perspective as well. Multiplexing two full addresses increases the gate delay and complicates timing closure. The design for rank-based incrementing is also complicated by the need to "hold" certain bits (the rank address bits) constant during the linear increment operation, while ensuring proper "carry" function to the higher order bits as necessary for all supported address map configurations. Conventional implementation of the increment logic in hardware has been irregular and left many "special case" conditions to be supported in logic. Having many "special case" conditions complicates test procedures and verification times while consuming computation resources.

The combined rank and linear address incrementing utility 20 provides a significantly improved incrementing utility through a dual address increment logic function that can be used in both a linear address mode increments as well as a rank address mode. The utility splits the address increment function into two portions, a rank register and a non-rank register, having corresponding dedicated hardware registers. The resultant values of the non-rank and rank register are combined to provide a full selected address, which is suitable for any desired test operation.

Figure 2:
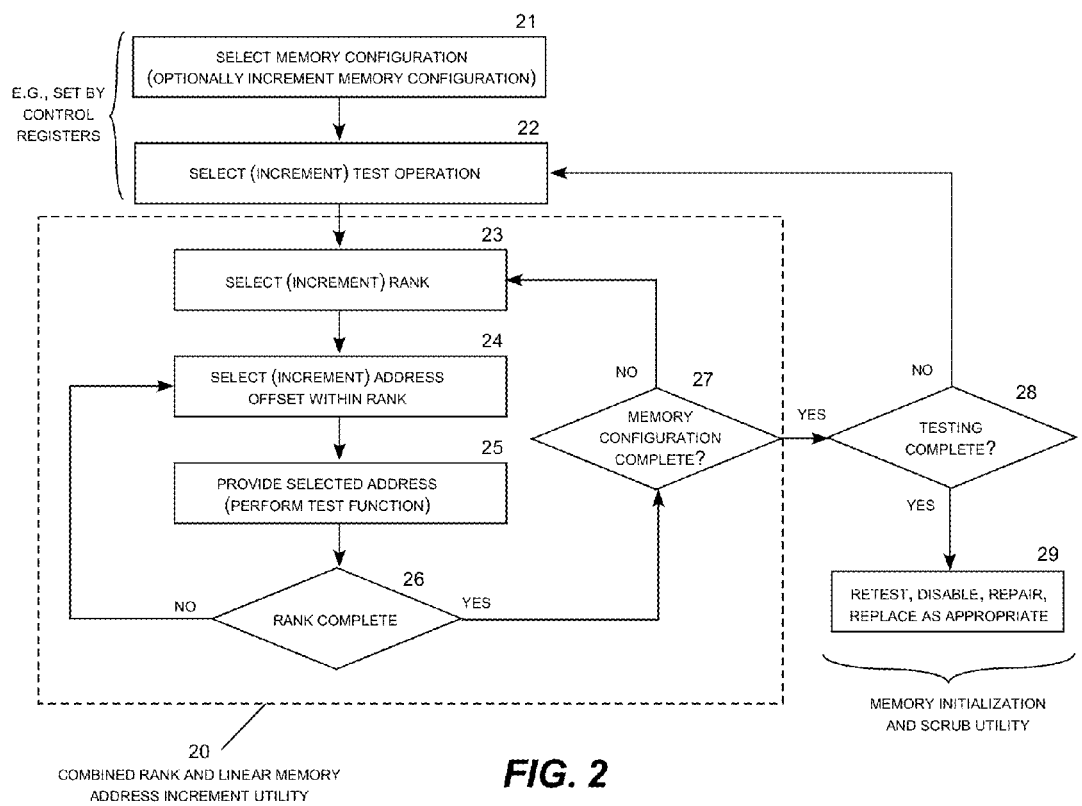
FIG. 2 depicts a process flow for a computer testing operation using the combined linear and rank address incrementing utility in accordance with an embodiment.

FIG. 2 depicts a process flow for performing a computer testing operation using the combined linear and rank address incrementing utility 20. This procedure is performed by the memory initialization and scrub utility 18, in which the address incrementing utility 20 implements the address generation sub-functionality. As noted above, the address incrementing utility 20 may selectively perform its address generation function on a linear basis (sequential address generation for a single rank), or on rank-by-rank basis (walking the ranks) as requested by the memory initialization and scrub utility 18. In block 21, the memory initialization and scrub utility 18 selects a memory configuration to test. In embodiments in which the computer 10 contains a number of different types of memory configurations, the initialization and scrub utility may select from or increment through a number of different types of memory configurations for testing. In block 22, the memory initialization and scrub utility 18 selects a test operation to run on the selected memory configuration, such as a memory initialization operation, a scrub operation (e.g., read and error check), an LBIST operation (e.g., pattern testing), an ABIST operation that may involve interaction with an external system, or another desired test operation.

Is should be noted that the address incrementing utility 20 is generally indifferent to the specific test operation performed by the memory initialization and scrub utility 18. The memory configuration selected in block 21 identifies a corresponding memory address map and the type of test selected in block 22 identifies indicates whether the address incrementing utility 20 is to operate in linear or rank mode and may optionally identify specific ranks to be tested. For example, the memory initialization and scrub utility 18 may select the memory configuration to test in block 21 and the test to run in block 22 by setting predefined hardware control registers exposed by the address incrementing utility 20 (see FIG. 3 described below).

In block 23, the address incrementing utility 20 selects or increments the rank. In block 24, the address incrementing utility 20 selects or increments the address offset within the rank. In block 25, the address incrementing utility 20 provides the selected address to the memory initialization and scrub utility 18, which performs a test operation on that specific bit, such as reading, writing and then reading, or resetting (clearing) the bit. In block 26, the address incrementing utility 20 determines whether all of the addresses have been generated for the selected rank. If all of the addresses have not been generated for the selected rank, the "NO" branch is followed to block 24, in which the address offset is incremented.

If all of the addresses have been generated for the selected rank, the "YES" branch is followed to block 27, in which the address incrementing utility 20 determines whether all of the ranks have been generated for the selected memory configuration. If all of the ranks have not been processed for the selected memory configuration, the "NO" branch is followed to block 23, in which the rank is incremented. If all of the ranks have been processed for the selected memory configuration, the "YES" branch is followed to block 28, in which the memory initialization and scrub utility 18 determines whether the testing operation has been completed. If the testing operation has not been completed, the "NO" branch is followed to block 22, in which the test operation is incremented representing selection of another test operation. If the testing operation has been completed, the "YES" branch is followed to block 29, in which the memory initialization and scrub utility 18 may perform a variety of procedures to retest, disable, repair or replace the tested memory configuration. The address incrementing utility 20, which is generally indifferent to the functionality of the memory initialization and scrub utility 18 performed in blocks 28 and 29, is configured to "walk the ranks" for a wide range of memory configurations and testing procedures.

Figure 3:
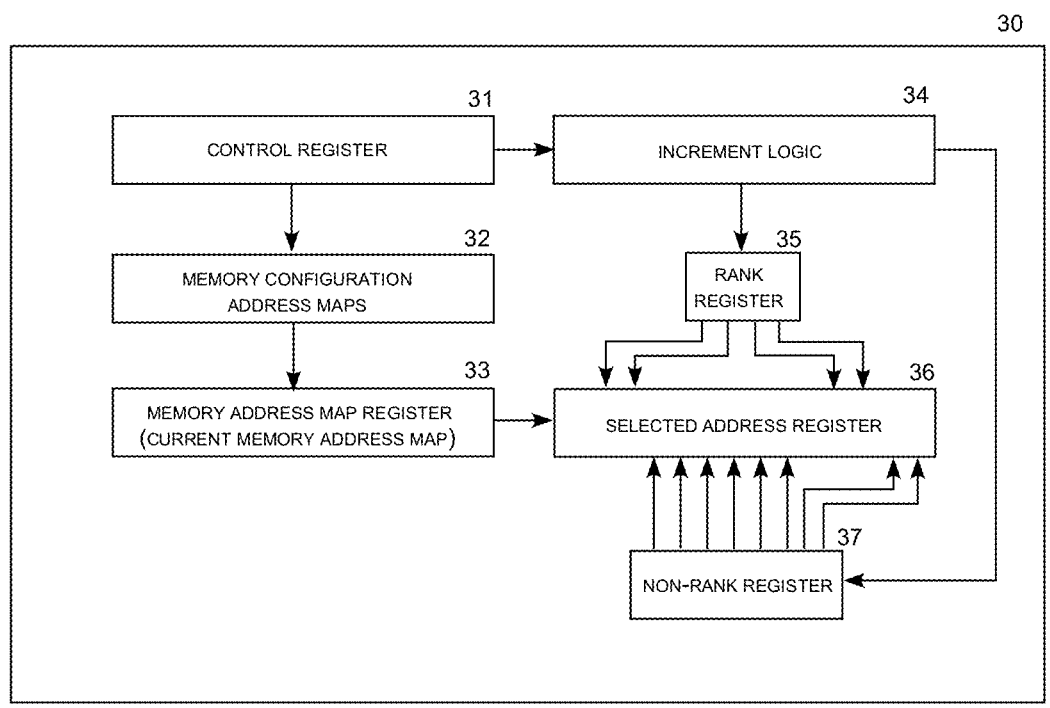
FIG. 3 depicts a schematic diagram for the combined linear and rank address incrementing utility in accordance with an embodiment.

FIG. 3 is schematic diagram 30 of an illustrative address incrementing utility 20 in which block 31 represents the control registers accessed by the memory initialization and scrub utility 18 in blocks 21 and 22 of FIG. 2. The memory address map corresponding to the selected memory configuration may be retrieved from a library of memory address map 32 and loaded into a memory address map register 33 (i.e., a current memory address map is loaded into the memory address may register 33). Block 34 in FIG. 3 represent firmware for implementing the increment logic, which is shown in logic block format in blocks 23-27 of FIG. 2 When performing the increment logic 34, the address incrementing utility 20 utilizes a hardware rank register 35, a selected address register 36, and a non-rank register 37. The rank register 35 contains the rank bits of the memory address map register 33, while the non-rank register 37 contains the non-rank address offset bits of the memory address map register 33. For each rank, the increment logic 34 causes the address incrementing utility 20 to hold the rank bits in the rank register 35 while incrementing through all of the address offsets of the non-rank register 37 to sequentially generate all of the addresses for the selected rank.

The increment logic 34 causes the address incrementing utility 20 to increment the rank to generate the addresses for each rank on a rank-by-rank basis (walks the ranks). Generally, the rank register 35 maps to address fields of the selected address register 36 that are not contiguous, typically including a least some low-order bits and some high-order bits separated by a section mapped from the of the non-rank register 37. Similarly, the non-rank register 37 may also map to address fields of the selected address register 36 that are not contiguous, typically including a least some bits on either side of the low-order field mapped from the rank register 35. While this is the typical arrangement of a DRAM memory configuration, embodiments may defined for memory configurations in which the rank register 35 and/or the non-rank register 37 map to contiguous portions of the selected address register 36. In this case, memory configurations in which the non-rank register 37 maps to contiguous addresses in the selected address register 36 are more likely because of the operational optimization aspects associated with dividing the rank address fields within the selected address register 36.

It will therefore be appreciated that the address incrementing utility 20 provides a dual address incrementing function that splits the increment function into two blocks, the rank register 35 to manage the rank portion of the address (which may be referred to as the rank address), and non-rank register 37 to manage the non-rank portion of the address (which may be referred to as the address offset). By splitting the full address into a rank address separate from the address offset, both increment operations can be more easily implemented utilizing firmware logic and dedicated hardware registers as shown schematically in FIG. 3. In particular, the non-rank address offset may be implemented as a simple "+1" add of the current address, up to the maximum address offset value (e.g., 0xFFF . . . FFF). Address offset fields that are not contiguous in memory address map are combined into to contiguous non-rank register to avoid the need for special "carry forward" logic to skip over a rank address field while incrementing through the address offset values. The rank address remains constant (no rank increment performed) until the non-rank address reaches the final offset value, at which point on the rank address is increment by "+1" and the non-rank address wraps to the initial address offset value (e.g., 0x000 . . . 000). As a result, the rank address increments only when the maximum address offset within the non-rank register is reached. The rank address fields are also combined into a single rank register 35 without having to provide for special "carry forward" logic to combine the low-order and high-order register address bits as they appear in the memory address map.

It will therefore be appreciated that rank incrementing may not be utilized when the address incrementing utility 20 runs in a linear (single rank) mode. While there are no specific ranks in linear mode for the purposes of the address incrementing, some of the bits may, in a particular embodiment, feed rank select bits in the memory. That is, the purpose of the linear address is to scrub the reads more consistently with how the system addresses tend to be ordered, which is usually on a rank-basis. Nevertheless, any desired linear run may be defined, even if it involves partial or multiple ranks, for example to test any particular contiguous section of the logical memory address space.

Figure 4:
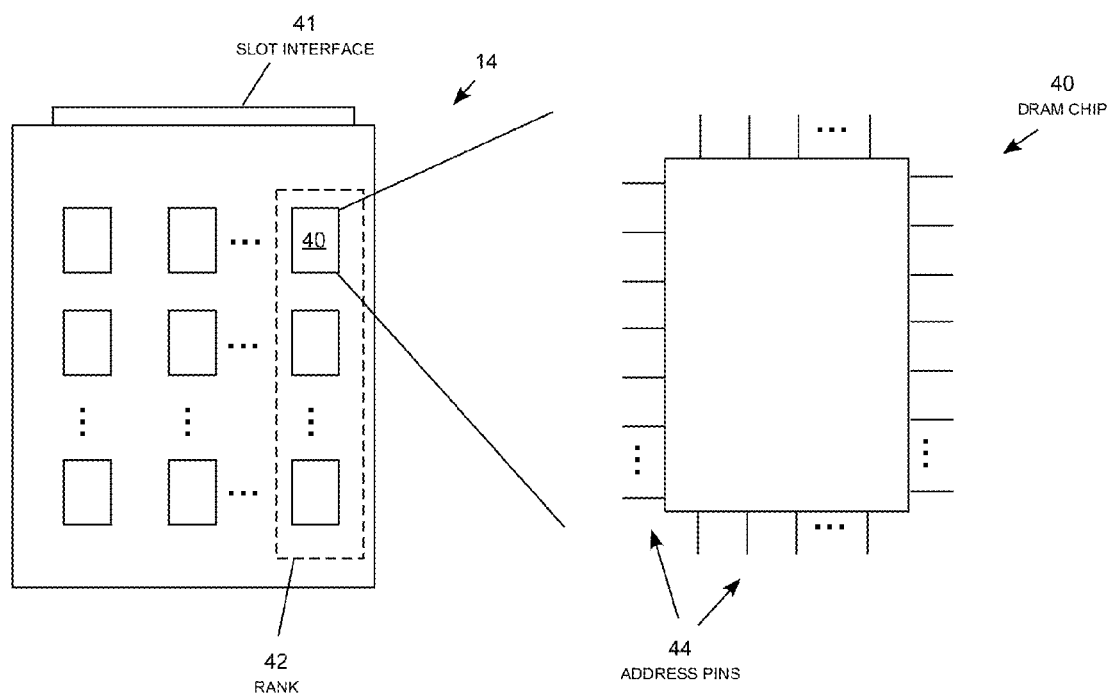
FIG. 4 depicts a memory configuration layout that may be tested using the combined linear and rank address incrementing utility in accordance with an embodiment.

FIG. 4 depicts a memory configuration 14 (e.g., DRAM board) that may be tested using the combined linear and rank address incrementing utility 20. The memory configuration 14 includes an array of memory units 40 (e.g., DRAM chips) that are usually the same type of chip. The memory configuration 14 ordinarily has a slot interface 41 configured to be physically received within a slot connector of a multi-board interface, sometimes referred to as a cage. The specific memory configuration 14 may therefore be referenced by its corresponding slot number. The memory configuration 14 is usually divided into a number of multi-chip ranks represented in this example by the rank 42 formed by a column of chips. Each chip 40 typically includes a number of address pins 44. The memory address map for the memory configuration 14 identifies the memory configuration itself as well as each rank and each address pin so that each memory address of the configuration can be uniquely generated.

Figure 5:
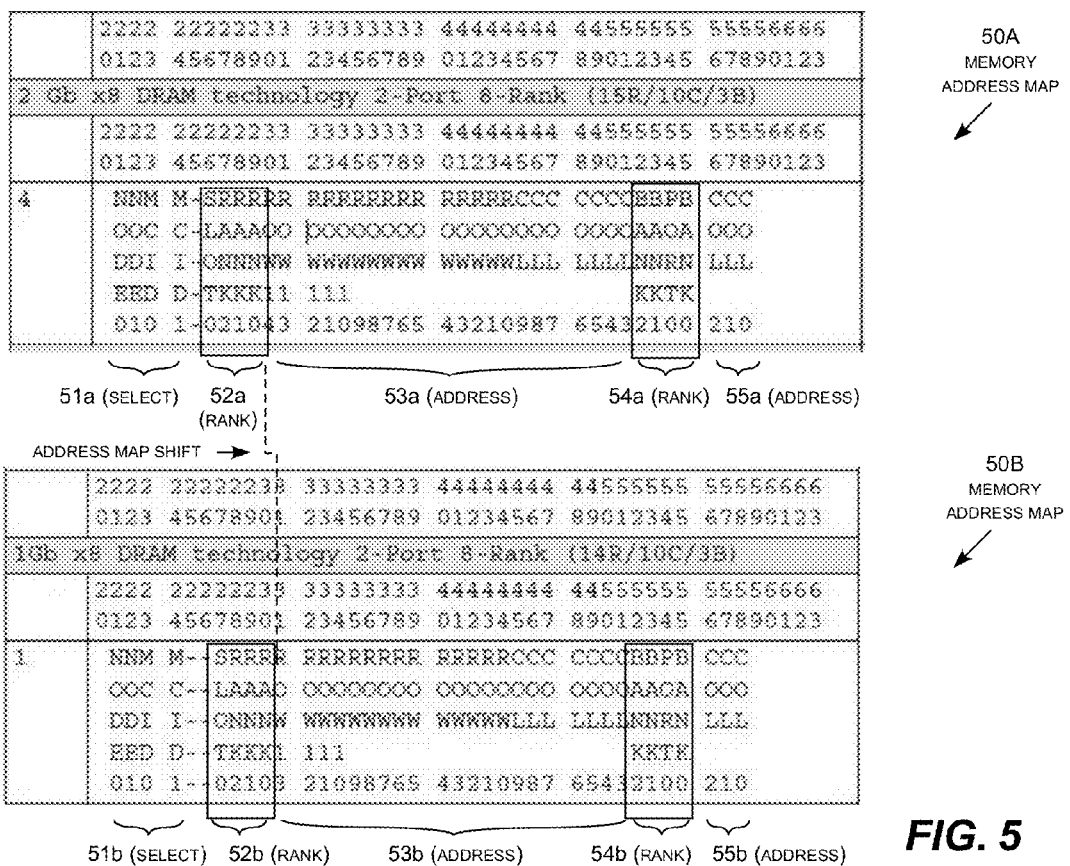
FIG. 5 depicts two specific examples of memory address maps for the combined linear and rank address incrementing utility in accordance with an embodiment.

FIG. 5 depicts two specific examples of memory address maps 50A and 50B for the combined linear and rank address incrementing utility 20. The first address map 50A corresponds to a two Gb DRAM configuration with two ports and eight ranks. Four bits form a select field 51a for identifying the memory configuration followed by one unused bit. The rank address is divided into two portions including a five-bit high-order field 52a and a four-bit low-order field 54a. The address offset bits include a first 22-bit address field 53a falling between the register address fields 52a and 54a. A second three-bit address field 55a is located after the low-order rank address field 54a.

The second address map 50B corresponds to a one Gb DRAM configuration with two ports and eight ranks. Four bits form a select field 51b for identifying the memory configuration followed by two unused bit. The rank address is divided into two portions including a five-bit high-order field 52b and a four-bit low-order field 54b. The address offset bits include a first 21-bit address field 53b falling between the register address fields 52b and 54b. A second three-bit address field 55b is located after the low-order rank address field 54a.

The difference in the memory configuration address maps 50A and 50B result in a one-bit address map shift between the high-order rank address field 51a of the first memory address map 50A and the high-order rank address field 51b of the second memory address map 50B. The address offset fields 53a and 53b are similarly offset, while full address maps skip across the low-order rank address fields 54a and 54b, respectively. In addition, the linear rank incrementing "carry forward" logic to skip over the low-order ranks address fields 54a and 54b is slightly different for each configuration. The rank incrementing "carry forward" logic is also slightly different for each configuration. The combined linear and rank address incrementing utility 20 accommodates these difference utilizing the same dedicated hardware and firmware structure shown in FIG. 6.

Figure 6:
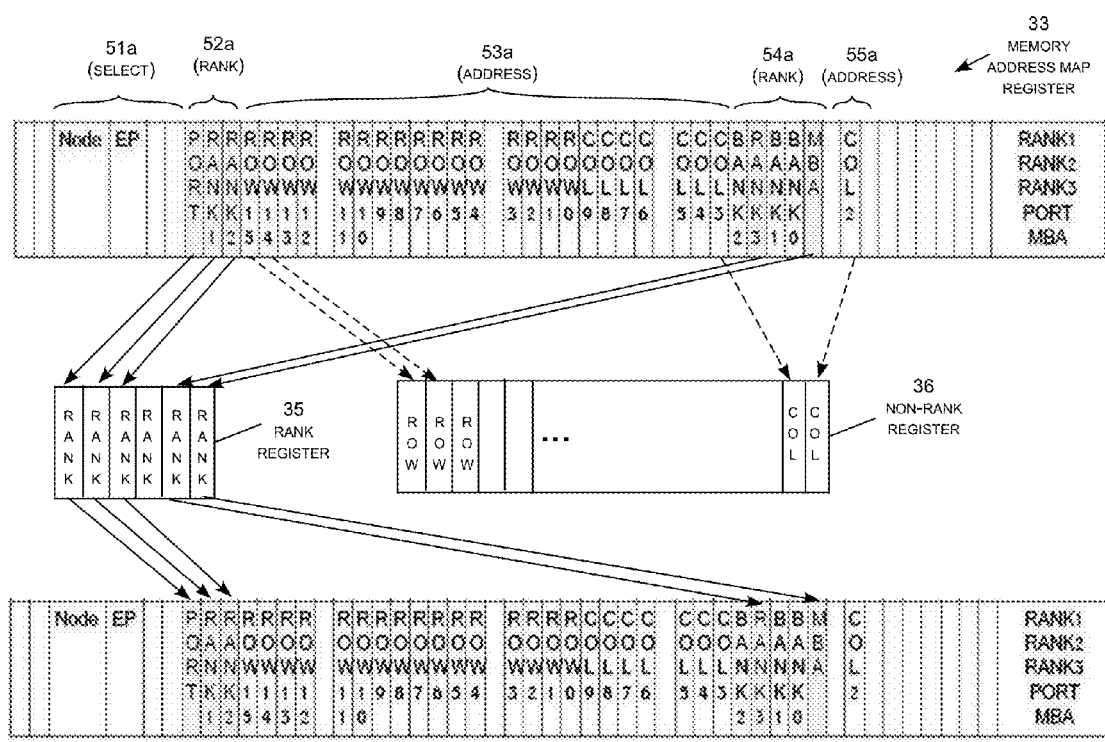
FIG. 6 depicts a specific memory address maps within a schematic diagram for the combined linear and rank address incrementing utility in accordance with an embodiment.

FIG. 6 depicts a memory address map register 33 containing an example of a current memory address map within a schematic diagram for the combined linear and rank address incrementing utility 20. The memory address map register 33 is sufficiently generalized to accommodate the specific examples of memory address maps 50A and 50B along with a wide range of other configurations in this general format (i.e., up to eight rank bits and up to 28 address offset bits). To do so, the memory address map register 33 accommodates eight rank address bits in the rank register 35 and 28 address offset bits in the non-rank register 36. Some of the available rank and/or non-rank bits may unused by a particular memory configuration, which allow the same memory address map register 33 to accommodate a range of different memory address maps including, as two specific examples, memory address maps 50A and 50B. Although 28 bits in the non-rank register 36 is sufficient for currently available DRAM boards, it should be noted that additional bits may be easily added to the non-rank register to accommodate larger address spaces as a matter of design choice.

Note also that the lowest-order bit (field 55a) of the non-rank register 36 is configured to load an initial starting address value into the non-rank address register. If a non-zero address value is assigned to the start address bit of the address offset register 36 prior to a scrub or self-test operation, the non-zero address value will be an offset into the rank indicated by the rank address bits. The non-rank address may therefore increment up to N−1 (the amount of memory in any given rank) before wrapping back to zero on the next memory address increment.

When running in linear address mode, the non-rank register 36 sequentially generates the complete address space to be tested. Incrementing the non-rank address therefore operates the same way in linear made and rank mode. For each memory access performed by the test operation, a complete memory address is constructed by combining the bits of the rank register 35 with the bits of the non-rank address register 36 in the manner defined by the current address map corresponding to the memory configuration being tested. Filling the selected memory address 36 from the rank register 35 and the non-rank register 36, which each increment without configuration-specific "carry forward" logic, simplifies the increment logic 34 while confining the configuration-specific address map definition to a separate block (i.e., the current memory address map 33, which is selected form the library of address maps 32). This separates the configuration-specific address map definition from the increment logic 34 and various hardware registers 34, 35, 36 and 37 used to efficiently generate the address corresponding to the address space for any selected memory configuration. Address mapping additions or updates can therefore be managed without affecting the increment logic. This reduces the verification impact of changes to the address map definitions and reduces potential schedule impacts due to address mapping changes that may arise late in the design cycle.

Previous address increment implementations required complex logic to determine rank bit locations within the address field during an increment operation and then exclude these bits from the increment operation. Excluding certain address bits from incrementing based on a specific address map definition in prior addressing incrementing systems was cumbersome and error prone due to corner case conditions, which could be difficult to expose in verification. Expanding this type of exclusion logic to support many different address map configurations increases the complexity of the logic and the opportunities for incorrect logic assignment statements.

The technical effects and benefits of the address incrementing utility 20 include increased efficiency and accuracy. The dual-mode incrementing architecture utilizing separate rank and non-rank registers is amenable to efficient configuration in dedicated hardware and firmware. This allow linear and rank modes of operation with reduced logic area, simplified design, reduced corner/special case logic conditions to verify, minimized timing paths, and simplified verification of the increment function for both modes. While dedicated hardware embodiments are streamlined, it should nevertheless be understood that embodiments may be provided as computer program products containing software instructions for implementing the utility.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Figure 7:
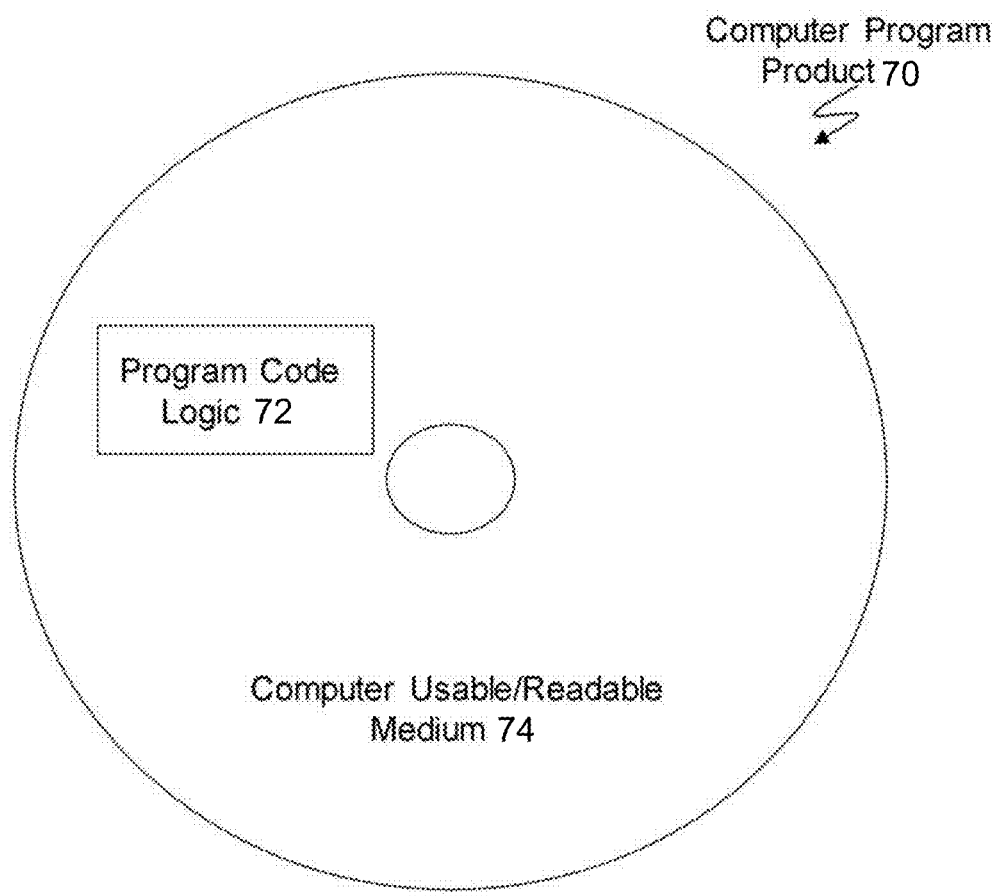
FIG. 7 depicts a computer-readable medium according to an embodiment.

Referring now to FIG. 7, in one example, a computer program product 70 includes, for instance, one or more storage media 72, wherein the media may be tangible and/or non-transitory, to store computer readable program code means or logic 74 thereon to provide and facilitate one or more aspects of embodiments described herein.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A combined rank and linear address incrementing utility for a computer system, comprising:
   a memory address map register configured to selectively store memory address maps for a plurality of different types of memory configurations;
   a rank register configured to store a plurality of rank address bits mapped from the memory address map register corresponding to one or more rank address fields of the memory address map register, wherein the rank register maps to rank address fields of the selected memory address register that are not contiguous;
   a non-rank register configured to store a plurality of non-rank address bits mapped from the memory address map register corresponding to one or more non-rank address fields of the memory address map register, wherein the non-rank register maps to non-rank address fields of the selected memory address register that are not contiguous;
   a selected address register configured to define a range of selected memory addresses within the selected address register based on a sequence of bits mapped from the rank register and the non-rank register;
   a control register for selectively setting the utility in a linear mode or a rank mode; and
   increment logic configured to increment the rank register and the non-rank register to sequentially generate ranges of addresses corresponding to address spaces of the different memory configurations for testing those memory configurations,
   wherein the increment logic is further configured to selectively operate in the linear mode for generating addresses corresponding to a selected rank, or in the rank mode for generating addresses corresponding to a plurality of ranks on a rank-by-rank basis.

* * * * *